US006812862B1

(12) United States Patent
Dempsey

(10) Patent No.: US 6,812,862 B1
(45) Date of Patent: Nov. 2, 2004

(54) KEYBOARD FOR AN ELECTRONIC DEVICE

(75) Inventor: Mark Dempsey, Beckenham (GB)

(73) Assignee: Psion Digital Limited (GB)

( * ) Notice: Subject to any disclaimer, the term of this patent is extended or adjusted under 35 U.S.C. 154(b) by 385 days.

(21) Appl. No.: 09/856,736

(22) PCT Filed: Sep. 27, 2000

(86) PCT No.: PCT/GB00/03700

§ 371 (c)(1),
(2), (4) Date: Jul. 3, 2001

(87) PCT Pub. No.: WO01/23990

PCT Pub. Date: Apr. 5, 2001

(30) Foreign Application Priority Data

Sep. 28, 1999 (GB) .............................................. 9922775

(51) Int. Cl.[7] .............................................. H03K 17/94

(52) U.S. Cl. .......................... 341/22; 200/5 A; 200/343

(58) Field of Search ............................ 341/22; 200/5 A, 200/343, 344, 345; 400/472; 345/168

(56) References Cited

U.S. PATENT DOCUMENTS 6,259,434 B1 * 7/2001 Tsai ........................... 345/168

* cited by examiner

*Primary Examiner*—Timothy Edwards, Jr.
(74) *Attorney, Agent, or Firm*—Synnestvedt, Lechner & Woodbridge, LLP; Richard C. Woodbridge, Esq.; Roy Rosser

(57) ABSTRACT

An electronic device comprising a keyboard in which one or more key caps each overlie a switch, the switch being activated when a key cap is depressed a predetermined amount, in which a key cap is directly joined to a key mat at a first section.

9 Claims, 4 Drawing Sheets

KEYBOARD FOR AN ELECTRONIC DEVICE

CROSS REFERENCE TO RELATED APPLICATIONS

This application claims the priority of U.K. application 9922775.3 filed 28 Sep. 1999 and PCT Application No. PCT/GB00/03700 filed on 27 Sep. 2000.

BACKGROUND OF THE INVENTION

1. Field of the Invention

This invention relates to a keyboard, and in particular to a keyboard for a low-cost computing or communications device such as a handheld computer, notebook computer, telephone, smart phone or communicator.

2. Description of the Prior Art

There are many different keyboard designs; all typically rely on the basic principle of a hinged keycap which, when depressed, causes an electrical contact to be completed. Innovations in keyboard design relate to many different performance factors, such as improving tactile response and increasing durability. In addition, the continuing downward price pressure on many consumer devices such as handheld computers requires manufacturers to devise ever cheaper keyboard designs. However, the considerable number of discrete components in conventional keyboard designs, particularly in the hinges of the keys, makes such designs relatively expensive.

A significant challenge is to provide a keyboard design which reconciles the need for economy with good tactile performance, such as adequate key cap travel.

SUMMARY OF THE INVENTION

In accordance with the present invention, an electronic device comprises a keyboard in which one or more key caps each overlie a switch, the switch being activated when a key cap is depressed a predetermined amount, in which a key cap is directly joined to a key mat at a first section. By providing for the key cap to be joined (for example, bonded) directly to the key mat, a live hinge is created at the first section, (i.e. a hinge formed from one or more components, some of which deform to allow the hinging action, rather than a conventional hinge in which one component rotates around another). This arrangement is significantly cheaper to manufacture than conventional key hinge arrangements.

The key mat may deform at defined zones to allow the key cap which is joined to it to readily pivot downwards to cause a switch to be closed. Such a design has fewer components than many conventional designs and may therefore be not only considerably cheaper, but also provide good tactile characteristics, such as the length of key travel on depression.

Typically, a part of the keycap is directly joined to the key mat by glue or adhesive tape; this constructional technique is very economical. One or more features, such as channels or grooves, may be present in the key mat near the first section, the or each feature determining the movement of the key cap when depressed, i.e. defining at least in part the structure of the live hinge. Such a feature may also substantially reduce key mat movement under and adjacent to a key cap from having an effect on the key mat under and adjacent to a different key cap and hence, that different key cap itself. Isolation of this kind is conventionally achieved using a bezel around each key cap, which is expensive and unattractive.

In another aspect, there is a key assembly for an electrical device comprising a key cap which overlies a switch, the switch being activated when a key cap is depressed a predetermined amount, in which a key is directly joined to a key mat at a first section.

These and other features of the invention wilt be more fully understood by reference to the following drawings.

DETAILED DESCRIPTION OF THE PREFERRED EMBODIMENT

During the course of this description, like numbers will be used to identify like elements according to the different views that illustrate the invention.

Figure 1:
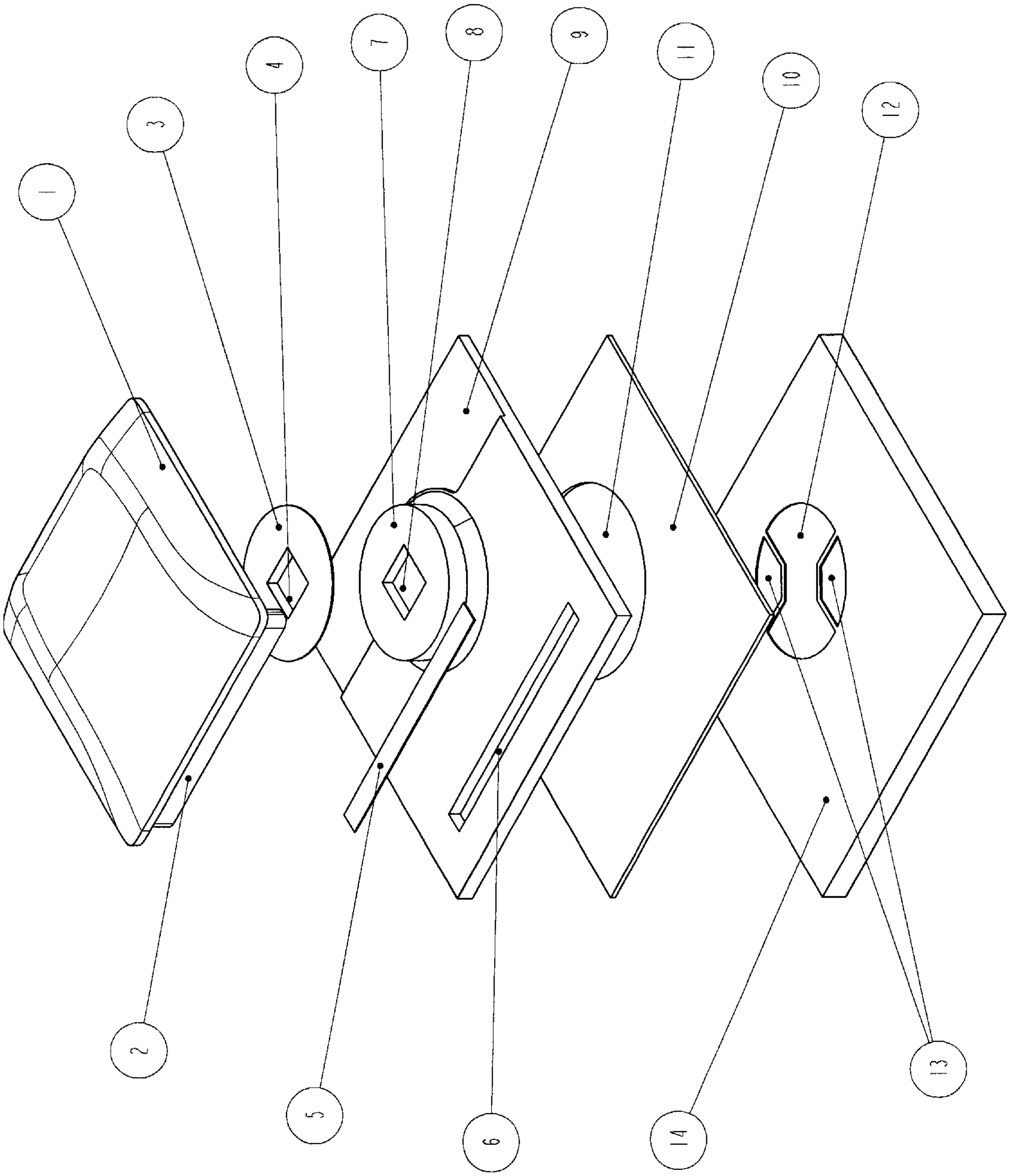
FIG. 1 is a perspective view of an exploded key assembly, including key cap and key mat, in accordance with the invention.
Figure 2:
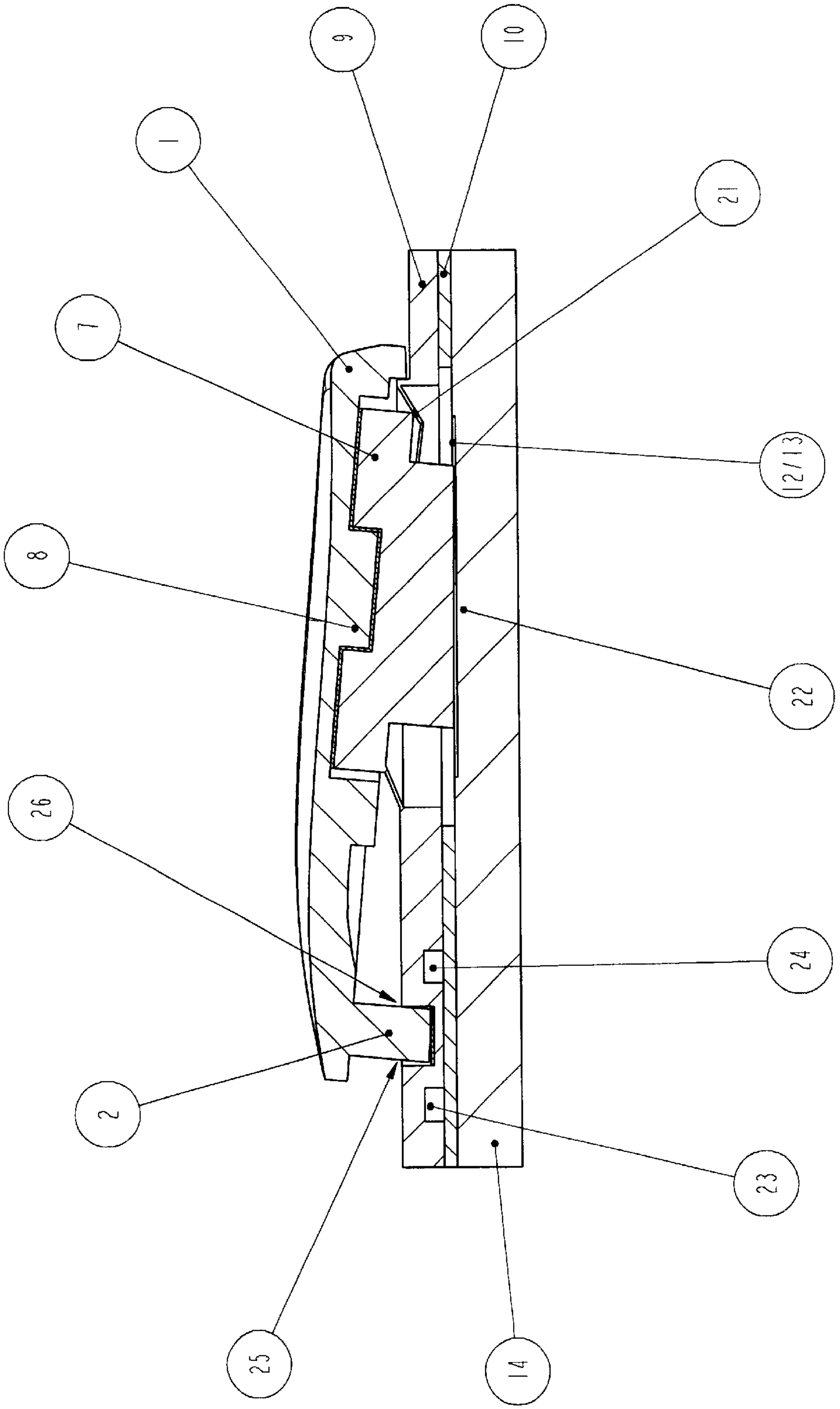
FIG. 2 is a side sectional view of the key assembly in the depressed position.
Figure 3:
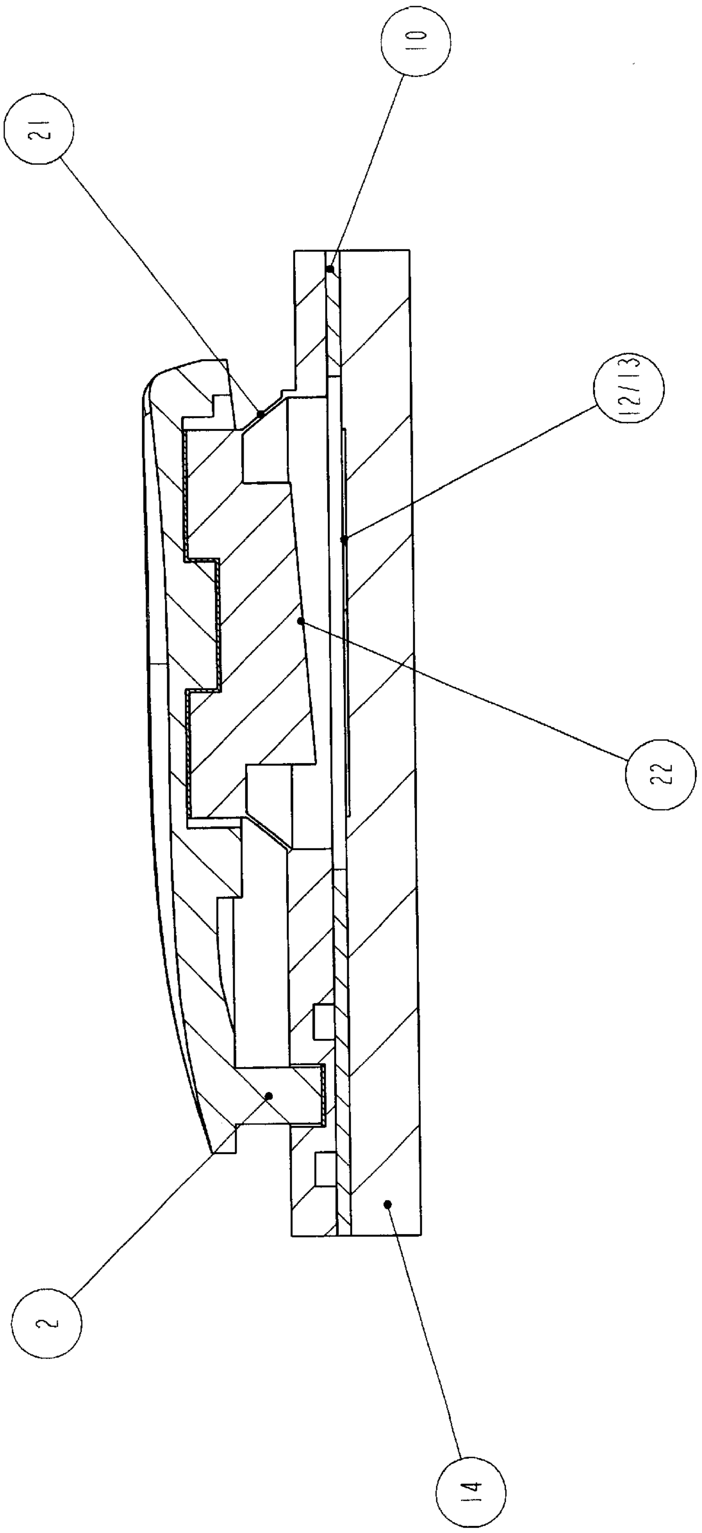
FIG. 3 is a side sectional view of the key assembly in the non-depressed position.

Referring now to FIGS. 1, 2 and 3, key cap 1 ties over a switch comprising electrical contacts 12 and 13 formed on the surface of a printed circuit board 14. When key cap 1 is sufficiently depressed (as shown in FIG. 2), a carbon conductive pill (not shown on FIG. 1, but shown in FIGS. 2 and 3) formed on the underside of a dome 7 formed in a key mat 9 touches electrical contacts 12 and 13, activating a switch. Key cap 1 includes a rib 2 at one end which is fixed into a channel 6 in key mat 9 using an adhesive strip 5. The contact point of the rib 2 and key mat 9 forms a live hinge about which key cap 1 can rotate, with the key mat 9 flexing slightly to accommodate the movement of the rib 2.

Key cap 1 is secured to a dome 7 formed in the key mat 9 with an intermediary adhesive washer 3. A square profile in the base of the key cap 1 engages a square aperture 4 in the washer 3 and a square recess 8 formed in the dome 7. Key mat 9 is secured to PCB 14 with adhesive tape 10. The dome 7 in the key mat 9, when fully depressed, moves through an aperture 11 in the adhesive tape 10.

FIGS. 2 and 3 show the key in respectively closed and open positions. The sides 21 of dome 7 deform when the key cap 1 is depressed (as shown in FIG. 2), providing resistance to downward movement, which is important for the correct feel, and forcing the key cap 1 back up to its open position (as shown in FIG. 3) when pressure is released. As noted above, the key cap 1 hinges not on a conventional hinge, but instead on the live hinge formed by the rib 2 adhesively secured to key mat 9. The actual hinge point is the line which runs in the middle of rib 2. Typically, the rib and key cap tip about 5 degrees to move from the fully non-depressed to the fully depressed positions. Within the key mat 9 there is a very small lateral stretch at region 25 and a small lateral compression at region 26 when the key cap 1 is fully depressed. In FIG. 2, dome 7 is pressed down and carbon conductive pill 2 closes an electrical connection between electrical contacts 12 and 13. In FIG. 3, the dome 7 is released and pill 2 no longer completes the circuit between contacts 12 and 13.

Figure 4:
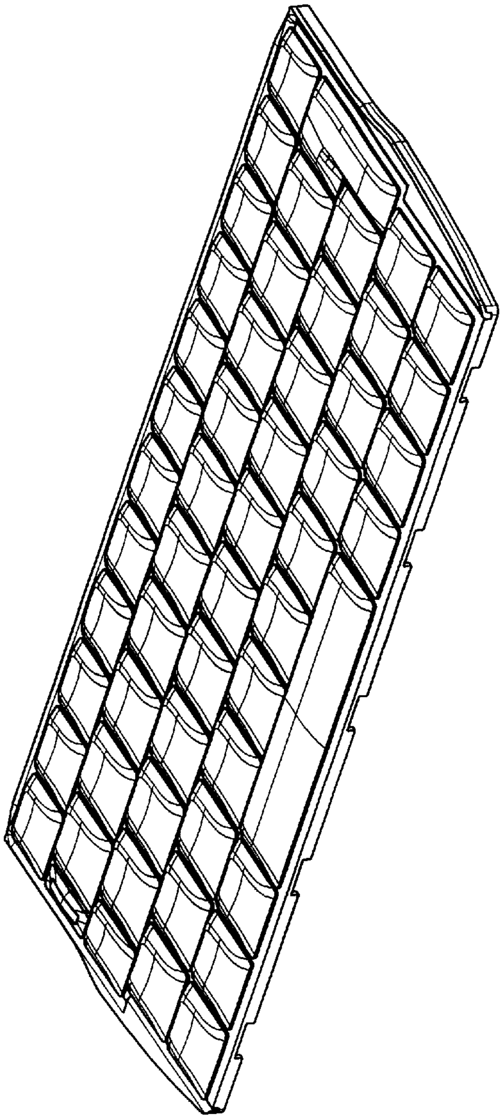
FIG. 4 is a perspective view of a keyboard in accordance with the present invention.

Additional elements apparent from these figures is the presence of small channels 23 and 24 formed on the underside of key mat 9 and running parallel and adjacent to the channel 6 in the key mat into which the rib 2 of key cap 1 sits. The small channels 23 and 24 operate to encourage the flexing of the key mat 9 required when the key cap 1 is depressed and also isolate the flexing of the key mat under key cap 1 to a region local to key cap 1, preventing the striking of any given key cap from distorting the key mat 9 under adjacent key caps. Conventionally, this requires a separate bezel into which key caps sit. As can be seen from FIG. 4, a keyboard can be formed using the present invention which is bezel free. This is cosmetically superior to a bezel based keyboard and facilitates more rapid typing.

White the invention has been described with reference to the preferred embodiment thereof, it will be appreciated by those of ordinary skill in the art that modifications can be made to the parts that comprise the invention without departing from the spirit and scope thereof.

What is claimed is:

1. An electronic device comprising a keyboard in which one or more rigid key caps each overlie a switch, the switch being activated when said rigid key cap is depressed a predetermined amount, and in which said rigid key cap is directly joined to a deformable key mat at a first slotted section of said deformable key mat, without there being an intervening hinge between the key cap and the key mate, the key mat being deformable to enable the key cap to pivot downwards to cause a switch to be closed.

2. The device of claim 1 in which a live hinge is created at the first slotted section.

3. The device of claim 1 or claim 2 in which the rigid key cap is adhesively joined to the deformable key mat at the first slotted section.

4. The device of claim 1 in which the deformable key mat deforms at defined zones to allow the rigid key cap to pivot downwards to cause a switch to be closed.

5. The device of claim 1 in which one or more features, such as channels or grooves, are present in the flexible key mat near the first slotted section, or each feature determining the movement of the key cap when depressed to substantially reduce key mat movement under a key cap from having an effect on a different key cap.

6. A key assembly for an electronic device comprising a rigid key cap which overlies a switch, the switch being activated when the rigid key cap is depressed a predetermined amount, in which the rigid key is directly joined to a deformable key mat at a first slotted section of said deformable key mat, without there being an intervening hinge between the key cap and the key mate, the key mat being deformable to enable the key cap to pivot downwards to cause a switch to be closed.

7. A keyboard for an electronic device, comprising:

a switch;

a deformable key mat having a slot; and a rigid key cap having a rib located substantially at one end, said rib of said rigid key cap being fixedly attached within said slot of said deformable key mat and overlying said switch, such that said switch is activated when said key cap is depressed a predetermined amount.

8. The keyboard of claim 7 wherein said deformable key mat further includes a channel formed on an opposite side of said key mat to said slot, and substantially parallel to said slot, thereby facilitating deformation of said deformable key mat.

9. The keyboard of claim 7 wherein said rib of said rigid key cap is fixedly attached within said slot by an adhesive means.

* * * * *